US009257628B2

(12) United States Patent
Freudenberg et al.

(10) Patent No.: US 9,257,628 B2
(45) Date of Patent: Feb. 9, 2016

(54) PROCESS FOR PRODUCING NANOPARTICLES AND THEIR USE IN THE PRODUCTION OF HIGH-TEMPERATURE SUPERCONDUCTORS

(71) Applicant: BASF SE, Ludwigshafen (DE)

(72) Inventors: Thomas Freudenberg, Dresden (DE); Bernhard Holzapfel, Kreischa (DE); Oliver Brunkahl, Remagen (DE); Michael Baecker, Cologne (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/386,534

(22) PCT Filed: Mar. 20, 2013

(86) PCT No.: PCT/EP2013/055794
§ 371 (c)(1),
(2) Date: Sep. 19, 2014

(87) PCT Pub. No.: WO2013/139843
PCT Pub. Date: Sep. 26, 2013

(65) Prior Publication Data
US 2015/0072863 A1    Mar. 12, 2015

(30) Foreign Application Priority Data

Mar. 21, 2012    (EP) ..................................... 12160545

(51) Int. Cl.
| | |
|---|---|
| *H01L 39/12* | (2006.01) |
| *C01B 13/32* | (2006.01) |
| *C04B 35/45* | (2006.01) |
| *C04B 35/626* | (2006.01) |
| *C04B 35/632* | (2006.01) |
| *C01G 25/02* | (2006.01) |
| *C01G 27/02* | (2006.01) |
| *C01F 17/00* | (2006.01) |
| *C01G 1/02* | (2006.01) |

(Continued)

(52) U.S. Cl.
CPC ............... *H01L 39/126* (2013.01); *B82Y 30/00* (2013.01); *C01B 13/328* (2013.01); *C01F 17/0043* (2013.01); *C01G 1/02* (2013.01); *C01G 3/006* (2013.01); *C01G 25/02* (2013.01);
(Continued)

(58) Field of Classification Search
CPC ..... C04B 35/45–35/632; C01B 13/32–13/328; C01P 2004/40–2004/82; H01L 39/12–39/2425; C01F 17/00–17/0043; C01G 2004/52–2006/82
See application file for complete search history.

(56) References Cited

FOREIGN PATENT DOCUMENTS

| | | |
|---|---|---|
| DE | 102 37 915 A1 | 3/2004 |
| DE | 10 2006 025 770 A1 | 12/2007 |
| DE | 10 2008 004 818 A1 | 7/2009 |
| EP | 0 383 927 A1 | 8/1990 |

OTHER PUBLICATIONS

International Preliminary Report on Patentability issued Dec. 12, 2014 in PCT/EP2013/055794 (English Translation only).

(Continued)

*Primary Examiner* — Colleen Dunn
(74) *Attorney, Agent, or Firm* — Oblon, McClelland, Maier & Neustadt, L.L.P.

(57) ABSTRACT

Known processes for the production of nanoparticles of compounds of the transition metals Zr, Ti, Ta, rare earths (RE), Mn, and Fe via microemulsions lead to products that contain impurities from the reactants, particularly water, which make the further use of said nanoparticles difficult, for instance in high-temperature super conductors (HTSC). It is proposed that the nanoparticles be produced via anhydrous microemulsions having an outer phase composed of a nonpolar solvent and inner phase composed of a polar anhydrous solvent. The nanoparticles thus obtained exhibit good monodispersity and can be used in the production of $REBa_2Cu_3O_7$ super conductors by incorporation into the precursor coating solution.

17 Claims, 1 Drawing Sheet

Figure 1:
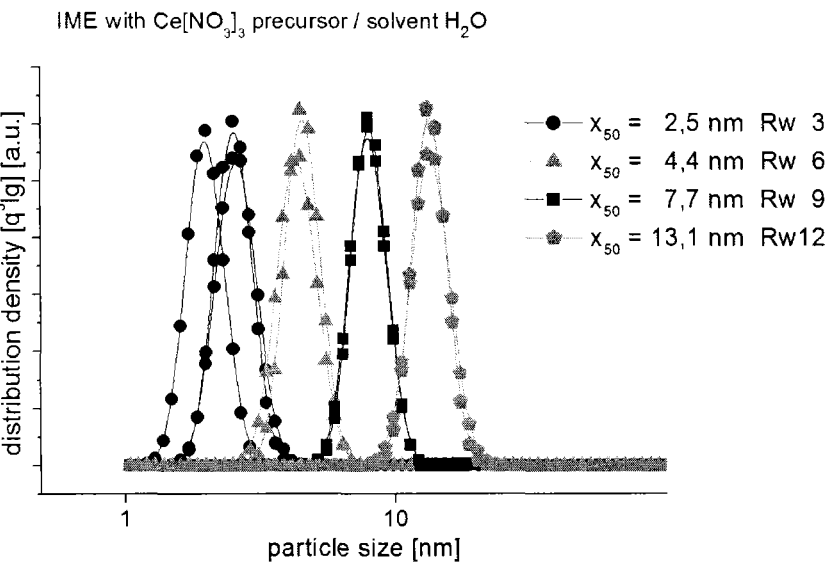

(51) Int. Cl.
   *C01G 3/00* (2006.01)
   *H01L 39/24* (2006.01)
   *B82Y 30/00* (2011.01)

(52) U.S. Cl.
   CPC ........... *C01G 27/02* (2013.01); *C04B 35/4508* (2013.01); *C04B 35/6264* (2013.01); *C04B 35/632* (2013.01); *H01L 39/2425* (2013.01); *C01P 2004/52* (2013.01); *C01P 2004/64* (2013.01); *C01P 2006/40* (2013.01); *C01P 2006/82* (2013.01); *C04B 2235/3215* (2013.01); *C04B 2235/3225* (2013.01); *C04B 2235/3229* (2013.01); *C04B 2235/443* (2013.01); *C04B 2235/444* (2013.01); *C04B 2235/445* (2013.01); *C04B 2235/449* (2013.01); *C04B 2235/5454* (2013.01)

(56) References Cited

OTHER PUBLICATIONS

A.E. Giannakas et al., "Variation of Surface Properties and Textural Features of Spinel $ZnAl_2O_4$ and Perovskite $LaMnO_3$ Nanoparticles Prepared via CTAB-butanol-octane-nitrate salt Microemulsions in the Reverse and Bicontinuous States", Journal of Colloid and Interface Science, vol. 259, No. 2, XP-055119750, Mar. 1, 2003, pp. 244-253.

Vishal Chhabra et al., "Nanophase $BaFe_{12}O_{19}$ Synthesized from a Nonaqueous Microemulsion with Ba- and Fe-containing Surfactants", Journal of Materials Research, vol. 10, No. 11, XP-008161844, Nov. 1, 1995, pp. 2689-2692.

International Search Report issued Jan. 10, 2014 in PCT/EP2013/055794 filed Mar. 20, 2013.

Rui-song Guo, et al., "Preparation and Properties of $ZrO_2$ Non-Aqueous Ceramic Inks by Reverse Microemulsion Method" Journal of Tianjin University, vol. 37, No. 5, XP008161852, May 1, 2004, pp. 428-433 (with English Abstract).

Özlem Altintaş Yildirim, et al., "Synthesis of zinc oxide nanoparticles elaborated by microemulsion method" Journal of Alloys and Compounds, vol. 506, No. 2, XP027273793, Sep. 17, 2010, pp. 944-949.

Tian Ma, et al., "Preparation of spherical zirconia powder in microemulsion system and its densification behavior", Materials and Design 25 (2004), pp. 515-519.

Office Action issued Sep. 29, 2015, corresponding Chinese application No. 201380014925.5 with English translation.

PROCESS FOR PRODUCING NANOPARTICLES AND THEIR USE IN THE PRODUCTION OF HIGH-TEMPERATURE SUPERCONDUCTORS

This invention relates to a process for the production of nanoparticles containing or preferably consisting of compounds of specific transition metals, and to the use of these particles in the production of high-temperature superconductors (HTSC).

There are known various methods of producing nanoparticles of compounds of the transition metals, among others also the process described in EP 383 927 A2. In that process, an aqueous phase containing the metal in a dissolved form, e.g. as a salt, or in the form of a sol, is emulsified in an organic liquid in the presence of an emulsifier to form a w/o emulsion, and the counterions are substituted for hydroxyl ions through the medium of a phase transfer catalyst, for instance by means of an ion exchanger. It is possible in this way, after drying and calcination, to obtain particles of oxides of the metals that can be smaller than 1 μm.

A similar process for the production of nanoparticles for high-density ceramics is disclosed in DE 102 37 915 A1. Here the formation of amorphous oxide particles is promoted by increasing the polarity of the O-phase in the microemulsion.

A process for the production of nanoparticles of cerium (IV) oxide is described by Masui et al., Chem. Mat 1997, 2197-2204. Here a w/o microemulsion is prepared having hexane as a continuous phase, cerium nitrate solution as an aqueous phase, polyoxyethylene (10) octylphenyl ether as a surfactant, and hexanol as a solubilizer for the surfactant. This microemulsion is mixed with a second one, prepared in the same manner, with ammonia solution as the aqueous phase. In this way, particles of cerium(IV) oxide having a size of 2 to 6 nm could be produced. This process avoids the complex handling of water-sensitive metal compounds such as alkoxides. It cannot be transferred to a different system, because when both emulsions are mixed, this may result in individual micelles colliding and fracturing, whereby the distribution of the particle sizes is undesirably widened.

DE 10 2006025 770 A1 discloses a process for the production of a coating dispersion containing nanoparticles, wherein a water-sensitive metal compound is mixed with an o/w microemulsion comprising a cationic surfactant in an alcoholic solution. Here the water content in the microemulsion preferably is at least 5 to 15% by weight. Coating dispersions of this kind can be used for the production of thin ceramic coatings. For obtaining thin layers even at low sintering temperatures, a molecular organometallic CSD solution can be added to the coating dispersion (hybrid solution). It is possible via said CSD solution to incorporate doping agents. (CSD means chemical solution deposition.)

Also known are the so-called high-temperature superconductors (HTSC) from metal oxide compounds where magnetic flux—in the form of so-called flux tubes—penetrates the superconductor in the presence of high outer magnetic fields. When electric current flows, the Lorentz force acts upon the flux tubes and moves the same through the superconductor. This movement is accompanied by a dissipation of energy that increases the resistance macroscopically and results in a collapse of the superconducting phase. The effect of energy dissipation caused by flux tube movement can be prevented and at least reduced by the incorporation of pinning centers, whereby higher current densities are possible. In an yttrium barium copper oxide (YBCO) superconductor, these pinning centers may consist for instance of barium zirconate (BZO) nanoparticles or may be induced by them. DE 10 2008 004 818 A1 for instance describes that a coating with a HTSC that includes pinning centers can be produced on a substrate by immersing the substrate in a precursor solution to which oxidic nanoparticles have been added.

A process for the production of thin HTSC layers of YBCO with incorporated pinning centers from BZO is described by Molina-Luna (L. Molina-Luna, Dissertation, Tübingen 2010, page 141). In this case, the basis is a solution of the yttrium, barium and copper trifluoroacetates in methanol. Nanoparticles are produced of BZO by adding barium and zirconium alkoxides to a microemulsion of water in a mixture of cyclohexane and methanol with a cationic surfactant. This BZO dispersion is then mixed with the solution of the trifluoroacetates and used for coating a substrate.

In the known process, inevitable associated materials such as water and compounds of the counterions of ionic surfactants remain in the coating solution. These materials may disturb the formation of a homogeneous HTSC layer because they may lead for instance to a non-uniform profile or cause the decomposition of the superconducting mixed oxide with a local separation of undesirable compounds of the individual metals in the mixed oxide. Also foreign ions that are carried along, e.g. from ionic surfactants, can become incorporated in the lattice of the HTSC. As a result, the performance of the HTSC layer, e.g. the obtainable critical current density $J_c$, is deteriorated (Araki et al., Supercond. Sci. Technol. 14 (2001); L21).

It is therefore an object of the present invention to provide a process allowing the production of nanoparticles of compounds of the transition metals which are largely free of disturbing associated materials and which are suitable for use in high-temperature superconductors comprising mixed copper oxides.

This object is achieved by a process as defined in claim 1 and by a process as defined in claim 12, for the production of a HTSC material.

The inventive process for the production of nanoparticles containing or consisting of compounds of the transition metals Zr, Hf, Ti, Ta, Sc, Y, La, elements with the atomic numbers 58 (Ce) to 71 (Lu), Mn, and Fe comprises the steps of:
- preparing a w/o microemulsion with a least one precursor of the aforementioned metals in the disperse polar (W) phase with the aid of a surfactant,
- adding a precipitant to the continuously nonpolar (O) phase, wherein a polar solvent having a water content of <1 mol-% is used as a solvent for said precursor in the polar phase and a base is used as a precipitant in said nonpolar phase.

Here said microemulsion is understood to be an emulsion whose inner disperse phase has a droplet size of less than 1 μm, preferably in the range of 1 to 100 nm, particularly preferably 2-30 nm. Since the droplets are separated from the continuous outer phase by a boundary layer of radially directed surfactant molecules, the same are also referred to as micelles. This emulsion can be prepared by mixing a nonpolar liquid, a sufficient amount of surfactant, and a polar liquid with each other while applying sufficiently high shearing forces. The size of the micelles can be influenced by the amount of the surfactant. It is possible to express the amount of surfactant as the ratio of the moles of substance of the inner phase to the moles of substance of the surfactant:

$$Rw = n(\text{inner phase})/n(\text{surfactant})$$

For a specific combination of nonpolar and polar phases and surfactants, the micelle size decreases as a rule as the Rw value decreases. According to the invention, suitable amounts of surfactant correspond to an Rw between 1 and 25, preferably between 2 and 15.

The polar solvent to be used in accordance with the invention must not be miscible with the nonpolar solvent of the outer phase of the microemulsion. On the other hand, its dissolving power must be sufficiently high for the precursor. In addition, the solvent's miscibility with the surfactant needs to be very low in order to not prevent the formation of micelles having a surfactant boundary layer. Accordingly, the selection of the polar solvent is determined by the type of the precursor and that of the nonpolar solvent. Suitable solvents and precursors can be obtained by preliminary tests. Suitable examples for the polar solvent are ketones, e.g. acetone, lactones, e.g. butyrolactone, nitriles such as acetonitrile, nitro compounds such as nitromethane, dialkyl carboxylic acid amides such as dimethylformamide, sulfoxides such as dimethylsulfoxide. Particularly preferred are the ketones, lactones, nitro compounds, amides, sulfoxides, alkyl or aryl compounds, C1 to C8 or C1 to C6 compounds, preferably C1 to C4 or C1 to C3 compounds, in the case of nitro compounds also C1 to C2 compounds. Particularly preferred are especially nitriles, in particular alkyl or aryl nitriles, specifically C1 to C7 nitriles or C1 to C6 alkylnitriles, preferably C1 to C4 or C1 to C2 alkylnitriles. Acetonitrile is specifically preferred.

The solubility of the precursor in the polar solvent must be sufficient for the formation of sufficiently large nanoparticles in the individual micelles. It should for instance be 0.5 to 10% by weight or up to 20% by weight, preferably at least 1 to 5% by weight. Suitable precursor solutions have for example concentrations of 0.025 to 2 mol/l, preferably 0.1 to 0.5 mol/l in relation to the precursor.

Solvents suitable as nonpolar solvents are for instance such which have already been used in prior art for micro emulsions with aqueous micelles. Examples are alkanes, alkenes, benzene and other aromates, carboxylic acid esters, ethers such as diethylether, halogenated hydrocarbons such as tetrachloromethane or hexafluorobenzene. Particularly preferred are alkanes, specifically C2 to C4 alkanes or C4 to C12 alkanes or their respective mixtures. These are for example hexane, heptane, octane or their technical mixtures in petroleum distillates.

The dissolving power of the solvent must be sufficient for the precipitant.

The phase volume ratio w/o of the microemulsion as used in the present invention preferably is between 2/98 and 20/80 or preferably between 4/96 and 15/85 during preparation.

As target compounds of the transition metals there are primarily considered oxides in all oxidation states of the respective metal. In the process according to the invention, preliminary stages can be initially generated in the micelles of the precursors under the influence of the precipitant, and the preliminary stages are converted into the target compound during a subsequent thermal treatment. In the case of oxides, such preliminary stages can be hydroxides for example. In addition to the mentioned transition metals, the compounds may still contain also other metals.

According to the invention, the metals of the precursor can be those chosen from the group of Zr, Hf, Ti, Ta, Sc, Y and La as well as elements with the atomic numbers 58 (Ce) to 71 (Lu), Mn, and Fe, either independently or in combination.

Rare earth metals in terms of the present invention are the elements Sc, Y, La as well as the elements with the atomic numbers 58 (Ce) to 71 (Lu), which can be used as metals of the precursors either independently or in combination.

According to the invention, the metals of the precursor can also be those chosen from the group of Zr, Hf, Ti, Ta, Sc, Y, and La as well as Ce, Sm, Eu, Gd, Tb, Yb, Lu, particularly from the group of Zr, Hf, Ti, Ta, Sc, Y, La, Ce, Sm, Eu, Gd, specifically from the group of Zr, Hf, Ti, Ta, Y, La, Ce, Sm, Eu, Gd; even more specifically from the group of Zr, Hf, Ce. The respective groups of the metals that are used can each be free from Hf and/or Fe, at least substantially.

Precursors are compounds of the respective metals, which under the influence of a base are capable of forming a compound that is insoluble in the polar solvent. These can be simple water-soluble inorganic or organic, neutral or basic salts such as nitrates, halides, particularly chlorides or oxide halides of the corresponding transition metals, as far as the same exhibit sufficient solubility in the polar solvent.

According to the invention, usual surfactants known in prior art can be used. Preferably, the surfactant is a nonionic surfactant. Such surfactants are composed of organic residues and contain no inorganic counterions. During the final thermal treatment of the coating composition for the formation of the HTSC or another ceramic they are removed from the layer without residue. Suitable nonionic surfactants comprise fatty alcohol alkoxylates, alkylphenyl alkoxylates, sugar surfactants (fatty alcohol glycosides). Here fatty alcohols are aliphatic monovalent primary alcohols having 8 to 22, preferably 12 to 18 carbon atoms. Alkylphenyl alkoxylates (alkylphenyl polyglycolethers) are particularly preferred. The surfactant must be sufficiently soluble in the outer phase. Also the balance between the nonpolar and polar moiety of the surfactant molecule must be appropriate to the system of nonpolar and polar phases. The HLB system in use for aqueous systems cannot be reliably transferred to the anhydrous systems of the invention. However, suitable series of surfactants having a graduated ratio between polar and nonpolar moieties are available to the expert, for example the polyoxyalkylene alkylphenyl ethers. The selection of a suitable surfactant is easily possible by carrying out preliminary tests. For the heptane-acetonitrile system, nonylphenyl poly(5) oxyethylene ether can be used for example.

As a precipitant any agent is suited which is soluble in the continuous outer phase of the microemulsion, can penetrate the surfactant envelope of the micelles and react with the precursor while forming the desired compound of the transition metal or a precursor compound therefor. For the formation of precipitation products of metal salts for the production of oxides, bases such as ammonia or organic amines are particularly suited. Advantageous are short-chain organic amines, because the same only add little carbon to the system, for example C1 to C10 alkyl or aryl amines or C1 to C6 alkyl amines or preferably C1 to C4 or particularly C2 to C4 alkyl amines. Propyl amine is particularly preferred for use as a precipitant.

For its addition to the outer phase, the precipitant is preferably dissolved and/or diluted with a suitable solvent, for example that of the outer phase.

Advantageously, the precipitant is used in excessive proportion to the precursor. Precipitant/precursor mol ratios of between 1 and 10 or 1.05 and 10, preferably between 1.05 and 5 are preferred. However, the stated mol ratio can also be 1.1 or 1.2, for example also 1.5.

The direct addition of the precipitant to the outer phase has the advantage that the micelles of the microemulsion are not affected by the addition of a different surfactant or of the same surfactant at a different concentration. Thus their size distribution remains uninfluenced and the resulting nanoparticles are almost monodisperse. Also the velocity of precipitation can be enhanced by the addition and thus the structure of the nanoparticles can be controlled.

The process of the invention produces nanoparticles that are largely free of associated materials. Thus they can be used, among other purposes, for the formation of pinning centers in HTSC coatings without adversely altering the coating by the addition of said nanoparticles.

Part of the invention also is a process for the production of HSTC materials comprising mixed copper oxides, wherein HTSC phase nanoparticles are incorporated into the mixed copper oxide using the nanoparticles that have been produced in accordance with the invention and wherein the HTSC material is formed by applying a solution of precursors of the mixed oxide components together with or separately from the nanoparticles to a substrate and by a thermal treatment. The mixed copper oxide is preferably produced in a third solvent on a substrate and the layer thus formed is subject to a thermal treatment.

Preferably, the mixed oxide is a rare earth metal-barium-mixed copper oxide, particularly preferably an yttrium-containing mixed copper oxide, especially $YBa_2Cu_3O_7$ (YBCO).

In a preferred embodiment, the precursor solution for the mixed copper oxide provided for the HTSC layer construction is mixed with the suspension of the nanoparticles in the nonpolar phase to form a hybrid solution before it is applied to the substrate. In this way, a homogeneous distribution of the nanoparticles in the HTSC layer is achieved as required for the particles in order to be effective as pinning centers.

For the preparation of this hybrid solution it is useful for the nonpolar solvent of the nanoparticle suspension being miscible with the third solvent of the mixed copper oxide precursor solution. This is not the case with the low alcohols described in prior art such as methanol or hexane or heptane as nonpolar solvent. For this reason, preferably an aliphatic alcohol, a ketone and/or a carboxylic acid, each independently comprising 4 to 12 carbon atoms such as n-hexanol, n-heptanol, n-octanol, n-nonanol or n-decanol, is used separately or as a mixture for the preparation of the precursor solution.

If the precursor solution contains metal salts of strong acids such as trifluoroacetic acid which give an acid reaction, the stabilization of the nanoparticle suspension may require the addition of a base. This can be diethanolamine for example.

The process of the invention also includes preparing several different nanoparticle dispersions in accordance with the invention and incorporating them into the HTSC layer of mixed copper oxide. This can be carried out for instance by preparing different nanoparticle dispersions according to the process of the invention and adding them to the coating solution. But it is also possible to mix different microemulsions prior to the precipitation reaction so that a mixture of several nanoparticle dispersions is obtained after precipitation.

The coating solution thus prepared is used for coating substrates in accordance with known processes (such as dip coating, spin coating, spray coating, printing methods). The layers are further processed in the usual manner, for example by subjecting to an incremental thermal treatment in which first the solvents are removed, then the organic salts are converted into oxides and finally the mixed oxide compound is generated. This may require a new optimization of the program for the thermal treatment. The layer arrangements thus obtained can still comprise further layers such as protective layers in addition to the HTSC material layer and the substrate layer.

The invention makes it possible to produce nanoparticles of compounds of the transition metals with a narrow size distribution. These nanoparticles can be advantageously used for the production of mixed copper oxide-based HTSC layers. Such layers exhibit excellent electric properties. In contrast thereto, dissatisfying results are obtained if the metal compounds required for the formation of pinning centers are directly added to the coating solution. In contrary to the use of the nanoparticles prefabricated in accordance with the invention, the size distribution of the pinning centers that are formed only after the coating step (e.g. during calcination) cannot be controlled, and the formation of these precipitates may disturb the epitactic growth of the superconductor layer.

The invention particularly relates to a process for the production of nanoparticles containing or consisting of compounds of the transition metals Zr, Hf, Ti, Ta, Sc, Y, La, elements with the atomic numbers 58 (Ce) to 71 (Lu), and Fe, the process comprising the steps of:

preparing a w/o microemulsion with at least one precursor of the mentioned metals in the disperse polar (W) phase with the aid of a surfactant, adding a precipitant to the continuous nonpolar (O) phase, wherein a polar solvent having a water content of <1 mol-% is used as a solvent for the precursor in the polar phase and a base is used as a precipitant in the nonpolar phase. Accordingly, the explanation of the invention, also that relating to the subjects of the claims 12 to 16 and 17 of the invention, generally relates also to a process for the production of nanoparticles containing or consisting of compounds of the transition metals Zr, Hf, Ti, Ta, Sc, Y, La, elements with the atomic numbers 58 (Ce) to 71 (Lu), and Fe. Further features and measures of the invention including the selection of the precursors in this particular case also relate to compounds of the transition metals Zr, Hf, Ti, Ta, Sc, Y, La, elements with the atomic numbers 58 (Ce) to 71 (Lu), and Fe.

EXAMPLES

Example 1

Production of the Nanoparticles (Comparison)

50 g of n-heptane were mixed with the amount of the surfactant Marlophen NP5 (nonylphenol poly(5) ethylenglycolether) required for establishing the Rw value stated in Table 1. The mixture thus obtained was stirred for 15 min at 600 rpm using a magnetic stirrer. Thereafter, 5.0 g (1 mmol) of the corresponding cerium nitrate solution were added dropwise. The two-phase mixture thus obtained was stirred for 60 min at 600 rpm for the micelles to homogenize. Thereafter, 1.59 g of an aqueous ammonia solution including 2.5% by weight (2.3 mmol $NH_3$) were added as a precipitant and were again stirred for 60 min at 600 rpm.

The resulting IME (inverse micro emulsion) with the precipitation product was measured by means of DLS (dynamic light scattering) and the value $D_{50}$ determined (Table 1). FIG. 1 shows the particle size distribution of the IME with four different Rw values.

Example 2

Production of the Nanoparticles (Invention)

Figure 2:
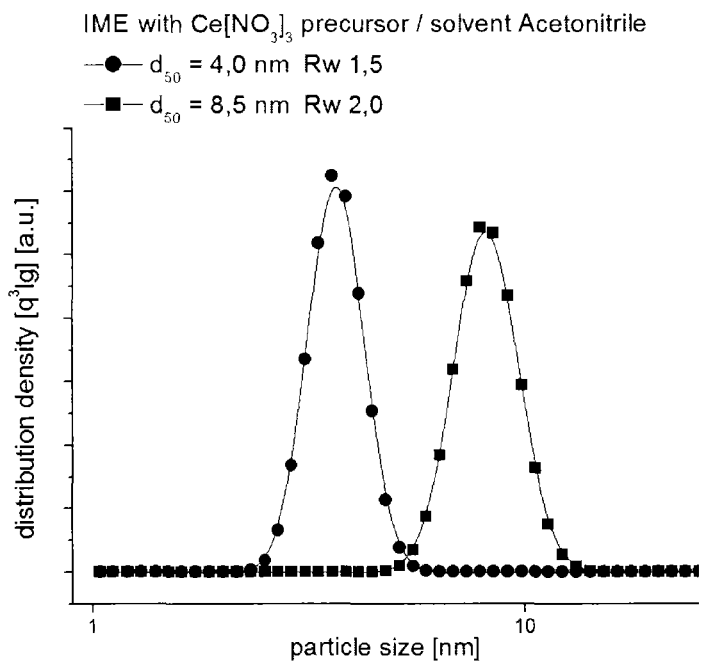

Example 1 was repeated, but acetonitrile having a water content of <0.5% by weight was used instead of water for the polar phase. Propylamine (10 percent by mass in n-heptane, 2.3 mmol) was used as a precipitant. The results are also shown in Table 1. FIG. 2 shows the particle size distribution of the IME at two different Rw.

TABLE 1

| Sample | Rw | Salt | Polar phase | M(salt sol.) [mol/l] | m(salt sol.) [g] | m(NP5) | $D_{50}$ [nm] | |
|---|---|---|---|---|---|---|---|---|
| 1-1 | 3 | $Ce(NO_3)_3$ | $H_2O$ | 0.2 | 5.0 | 40.76 | 2.5 | Comparison |
| 1-2 | 6 | $Ce(NO_3)_3$ | $H_2O$ | 0.2 | 5.0 | 20.38 | 4.4 | Comparison |
| 1-3 | 9 | $Ce(NO_3)_3$ | $H_2O$ | 0.2 | 5.0 | 13.59 | 7.7 | Comparison |
| 1-4 | 12 | $Ce(NO_3)_3$ | $H_2O$ | 0.2 | 5.0 | 10.19 | 13.1 | Comparison |
| 2-1 | 1.5 | $Ce(NO_3)_3$ | Acetonitrile | 0.2 | 5.0 | 35.78 | 4 | Invention |
| 2-2 | 2.0 | $Ce(NO_3)_3$ | Acetonitrile | 0.2 | 5.0 | 26.83 | 8.5 | Invention |

Example 3

Production of Nanoparticles (Invention)

Example 2 was repeated, but instead of cerium nitrate either hafnium oxide chloride or zirconium oxide chloride were used at the same molar mass respectively. The median values $D_{50}$ of the particle size distribution obtained at different Rw values are shown in Table 2.

TABLE 2

| Sample | Rw | salt | Polar phase | M(salt sol.) [mol/l] | m(salt sol.) [g] | m(NP5) [g] | $D_{50}$ [nm] | |
|---|---|---|---|---|---|---|---|---|
| 3-1 | 3 | $ZrOCl_2$ | Acetonitrile | 0.2 | 5 | 17.89 | 1.7 | Invention |
| 3-2 | 6 | $ZrOCl_2$ | Acetonitrile | 0.2 | 5 | 8.94 | 3.7 | Invention |
| 3-3 | 12 | $ZrOCl_2$ | Acetonitrile | 0.2 | 5 | 4.47 | 10.5 | Invention |
| 3-4 | 3 | $HfOCl_2$ | Acetonitrile | 0.2 | 5 | 17.89 | 1.5 | Invention |
| 3-5 | 6 | $HfOCl_2$ | Acetonitrile | 0.2 | 5 | 8.94 | 4.1 | Invention |
| 3-6 | 12 | $HfOCl_2$ | Acetonitrile | 0.2 | 5 | 4.47 | 7.7 | Invention |

Example 4

Production of HTSC Layers

An YBCO precursor solution was prepared, which contained the trifluoroacetates of yttrium, barium and copper at a mol ratio of 1:2:3. N-hexanol, n-heptanol or n-octanol served as a solvent in order to guarantee miscibility with the outer phase (hexane) of the cerium-containing microemulsion. The nanoparticle dispersion obtained in Example 2-1 was concentrated in vacuum and diluted with the YBCO precursor solution. With these solutions, layers having a thickness of 80-400 nm were applied to lanthanum aluminate substrates. The electrical properties of the layers are shown in Table 3.

TABLE 3

| Solvent YBCO | Critical current density $J_c$ [MA] | Transition temperature $T_c$ [K] |
|---|---|---|
| n-Octanol | 1.5 | 89.4 |
| n-Heptanol | 1.7 | 89.6 |
| n-Hexanol | 1.7 | 89.5 |

These results show that HTSC layers having very good properties can be produced by utilizing the $CeO_2$ nanoparticles produced in accordance with the invention.

The invention claimed is:

1. A process for producing nanoparticles comprising a compound comprising a metal, the process comprising:
    preparing a w/o microemulsion with at least one precursor of the metal in a dispersed polar phase with an aid of a surfactant, and
    adding a precipitant to a continuous nonpolar phase,
    wherein the metal is a transition metal Zr, Hf, Ti, Ta, Sc, Y or La, an element with an atomic number 58 (Ce) to 71 (Lu), Mn, or Fe,
    a solvent for the at least one precursor in the dispersed polar phase is a polar solvent having a water content of <1 mol-% and
    the precipitant in the continuous nonpolar phase is a base.
2. The process according to claim 1,
    wherein the compound is an oxide of the transition metal and/or a hydroxide of the transition metal.
3. The process according to claim 1,
    wherein the dispersed polar phase comprises precursors of several metals.
4. The process according to claim 1,
    wherein the polar solvent is an alkyl nitrile or aryl nitrile.
5. The process according to claim 1,
    wherein the precipitant is added as a solution or in dilution.
6. The process according to claim 1,
    wherein the precipitant is a short-chain organic amine.
7. The process according to claim 6,
    wherein the precipitant is a C1 to C6 amine.
8. The process according to claim 1,
    wherein the continuous nonpolar phase comprises a nonpolar alkane solvent having 6 to 10 carbon atoms.
9. The process according to claim 1,
    wherein the at least one precursor is a nitrate, chloride and/or oxide chloride of the transition metal.
10. The process according to claim 1, further comprising:
    separating the nanoparticles from the continuous nonpolar phase and
    drying the nanoparticle.
11. The process according to claim 1,
    wherein the surfactant is a nonionic surfactant.
12. A process for producing a high temperature superconductor material comprising a mixed copper oxide, the process comprising:
    incorporating nanoparticles produced by the process of claim 1 into the mixed copper oxide of a high temperature superconductor, and
    forming the high temperature superconductor material by applying a solution of at least one precursor of mixed copper oxide components to a substrate together with or separately from the nanoparticles and by carrying out a thermal treatment.

13. The process according to claim 12, wherein the at least one precursor of the mixed copper oxide components is applied in a third solvent to the substrate.

14. The process according to claim 12, wherein the mixed copper oxide is a rare earth metal-barium-copper oxide.

15. The process according to claim 12, wherein a precursor solution for the mixed copper oxide is mixed with at least one suspension of the nanoparticles in the continuous nonpolar phase to form a hybrid solution.

16. The process according to claim 12, wherein the third solvent is at least one selected from the group consisting of aliphatic alcohol, ketone and carboxylic acid, each having 4 to 12 carbon atoms.

17. A layer arrangement comprising a high temperature superconductor layer produced in the process according to claim 12.

* * * * *